(12) United States Patent
Ilowski et al.

(10) Patent No.: US 6,225,867 B1
(45) Date of Patent: May 1, 2001

(54) PROTECTION SCHEME FOR MULTI-TRANSISTOR AMPLIFIERS

(75) Inventors: John Ilowski; William Kung, both of Nepean (CA)

(73) Assignee: Nortel Networks Limited, Montreal (CA)

(*) Notice: Subject to any disclaimer, the term of this patent is extended or adjusted under 35 U.S.C. 154(b) by 0 days.

(21) Appl. No.: 08/996,997

(22) Filed: Dec. 23, 1997

(51) Int. Cl.[7] ..................................... H03F 1/52

(52) U.S. Cl. ..................... 330/298; 330/207 P; 361/104

(58) Field of Search .............................. 330/207 P, 298, 330/307; 361/104

(56) References Cited

U.S. PATENT DOCUMENTS 3,022,465 * 2/1962 Slenker et al. ................... 330/298 X

* cited by examiner

Primary Examiner—Robert Pascal
Assistant Examiner—Khanh Van Nguyen

(57) ABSTRACT

The present invention deals with the problems related to thermal runaway and over-voltage breakdown in integrated circuits using a series of power transistors interconnected in a parallel circuit arrangement. The general technique described consists of a protection scheme that involves the application of a fusible material to form ballast resistor components. These components are connected in series with each of the transistors in the integrated circuits. The main advantages are significant area and cost savings in the manufacturing of the integrated circuits as well as an increase in their yield, thereby reducing costly field maintenance and equipment returns.

10 Claims, 3 Drawing Sheets

PROTECTION SCHEME FOR MULTI-TRANSISTOR AMPLIFIERS

FIELD OF THE INVENTION

The present invention relates to the large field of integrated circuit design. More specifically, it relates to resolving problems related to thermal runaway and over-voltage breakdown in integrated circuits involving interconnected power transistors.

BACKGROUND OF THE INVENTION

Power amplifiers are used to amplify electrical signals in a wide variety of applications including cellular telephony, and radio and television broadcasting. For power ranges of up to about 100 watts, the most common power device used in these amplifiers is a bipolar junction transistor (BJT). In many cases, the power device is not a single transistor, but is composed of several transistors connected in a parallel circuit arrangement. This parallel circuit arrangement creates some technical problems for circuit designers since a limited number of weak transistors are responsible for circuit failure. Two of these problems, thermal runaway and over-voltage breakdown, are further explained below.

Thermal runaway: In an amplifier that is made up of several transistors connected in parallel, it is desirable for all the transistors to share the bias current equally. However, when bipolar junction transistors are used, the transistors with the highest temperature tend to carry more current. This can lead to a condition called thermal runaway. It a transistor carries a little more current than the others in the circuit, it will also dissipate more power, which will tend to heat the transistor even more. Since the transistor is now even hotter, it will tend to carry even more current. This self-heating operation can escalate until an over-current condition is reached and the transistor and amplifier circuits fail.

The most common solutions to prevent thermal runaway are: 1. To connect a ballast resistor in series with each of the transistors in the array; 2. To use a fuse to protect the entire circuit from high current conditions. This is, unfortunately, not an optimal solution since it requires field replacement (i.e. substantial costs). Also, for some integrated circuit technologies, a fuse would not protect the amplifier from damage during thermal runaway due to current hogging effects; and 3. To use thermal shutdown circuitry. A disadvantage of this solution is that it would require a reset signal and possibly field maintenance (i.e. substantial costs).

Over-voltage breakdown: Any transistor has a maximum operating voltage, above which the device will cease to function properly and may be damaged, Typically, when the applied voltage exceeds the maximum operating voltage, the transistor enters an operating state where the device current is uncontrolled and extremely high. This can lead to simultaneous over-voltage and over-current conditions. In an integrated circuit, which contains several transistors, the maximum operating voltage of the individual devices will not be uniform. Instead, they will have an operating range. In a mature manufacturing process, this voltage range will be relatively narrow and easily described by a statistical variation. On the other hand, in new or leading edge manufacturing processes, the voltage range will be relatively large due to material and process defects. The problem that this creates is that the circuit's operation is limited by the weakest transistor.

One solution for avoiding over-voltage breakdown is to limit the voltage that is applied to the circuit to a value that is lower than the maximum operating voltage for the weakest transistors in the circuit. For example, a circuit optimally designed to operate at 7 volts will be operated in the 5 volts range. Having to work in a lower design voltage range requires a larger number of power transistors (e.g. 20% to 25% more) to obtain the same power gain. The direct result in Lhis case is an increase in size of the amplifier circuit, hence an increase in costs.

When considering the above background information, it is clear that there is a need for a device which will permit continuous operation of transistor inclusive power devices for longer periods, thereby avoiding unnecessary field maintenance costs. Furthermore, this device should take up less space than those performing similar functions in existing integrated circuits.

OBJECTIVES AND SUMMARY OF THE INVENTION

An object of this invention is to provide an integrated circuit power amplifier which is less prone to circuit damage as a result of power transistor malfunction. To this effect, the invention provides a fusible protection scheme which eliminates, from an integrated circuit amplifier, weak power transistors before any damage has occurred.

As embodied and broadly described herein, the invention provides an integrated circuit power amplifier comprising a series of power transistors interconnected for producing, from an input signal, an output signal of a certain power level, wherein each power transistor is associated with a fusible structure that carries a current passing through the power transistor, said fusible structure having a fusible link for disabling the associated power transistor in the event that the output current of said associated power transistor exceeds a safe level.

In a particular embodiment, the fusible structure consists of a ballast fuse serially connected to the output of the associated power transistor. The ballast fuse consists of a body of resistive material which operates as a ballast resistance under normal operating conditions. The body of resistive material has a fusible portion which defines the fusible link.

This invention proposes the integration of a fusible structure with transistors (e.g. in the ballast resistance) as a protection scheme in multi-transistor power amplifiers. The integrated fuses will limit damage that may occur in parallel transistor configurations due to over-voltage and over-current conditions.

The proposed scheme will improve the reliability of integrated multi-transistor amplifiers where statistical variations in transistor breakdown characteristics are a concern. This will improve the manufacturing yield and reduce the number of field returns for equipment possessing multi-transistor amplifiers.

This scheme will be most successful in cases where it has been determined that a limited number of weak transistors in a parallel-connected amplifier circuit are the cause of the circuit failure. The proposed fuse structure will remove the weak device upon its failure while preserving the operational functionality of the circuit.

The use of a fusible link in an integrated circuit to protect it from over-voltage is common in some memory circuits such as EPROM (Electrically Programmable Read-Only Memory). However, in these circuits the electronic characteristics of the link in the infused state are not utilized. Placing a fuse in series with each transistor in a power amplifier in an integrated circuit, which is made up of several transistors in order to improve the yield and reliability, is a new concept.

Similarly, the use of a ballast resistor to prevent thermal breakdown in a bipolar junction transistor is a well-established technique. However, the integration of the ballast resistance function and the protection fuses function as a single circuit element is a new concept which results in significant area and cost savings in the manufacturing of the amplifier circuit. This protection scheme is applicable to any integrated circuit process where multiple transistors are used to provide the power amplification function, including gallium arsenide heterojunction bipolar transistors, silicone bipolar junction transistors and silicon germanium heterojunction bipolar transistors.

One of the problems outlined earlier is the requirement to limit the voltage that is applied to the circuit to a value that is lower than the maximum operating voltage for the weakest transistors in the circuit in order to avoid over-voltage breakdown. Having to work in a lower design voltage range requires a larger number of power transistors (e.g. 20% to 25% more) to obtain the same gain. On the other hand and as can be shown statistically, by connecting a combined resistor/fuse to the emitter of each transistor in the amplifier circuit, only 1% to 2% of the resistor/fuses will blow. Therefore, in a circuit with resistor/fuses at the emitter of each transistor only 1% to 2% more than the optimal number of transistors are required instead of 20% to 25%. In power amplifiers using a large number of power transistors, for example 100 power transistors or more, the resulting reduction in the number of power transistors may be quite significant. Such is the case, in particular, with power devices used in cellular telephony, and radio and television broadcasting.

Hence, this invention provides an integrated circuit power amplifier comprising an array of power transistors interconnected in a circuit arrangement, a subset of said power transistors being prone to thermal failure as a result of either one of a thermal runaway and an over-voltage breakdown established at operating conditions at which the power transistors of said array, which do not form part of said subset, will continue to function without manifesting a thermal failure, said integrated circuit power amplifier also comprising a fusible structure associated with each separate power transistor of said array, said fusible structure having a fusible link to isolate the associated power transistor from said circuit arrangement when fusing, said fusible link being selected to fuse when subjected to a current manifested by a power transistor undergoing a thermal failure. In a particular embodiment, the array of power transistors are interconnected in a parallel circuit arrangement and wherein each of said fusible structures is connected in series to the output of the associated power transistor and is selected to function as a ballast resistance.

In a particular application of the invention, the array of power transistors consists of bipolar junction transistors interconnected in a parallel circuit arrangement, the wherein the emitter of each bipolar junction transistor is serially connected to the associated one of said fusible structures, and wherein each fusible structure has an impedance selected to function as a ballast resistance.

The invention also provides a method for protecting an integrated circuit power amplifier comprising the steps of providing an array of power transistors interconnected in a circuit arrangement for amplifying an input signal to produce an output signal of a certain power level, associating with each power transistor of said array a fusible structure that carries the output current passing through the related power transistor, said fusible structure having a fusible link for disabling said related power transistor in the event that the power output current passing through said related power transistor exceeds a safe level. This method for protecting an integrated circuit power amplifier also contemplates using a fusible structure which has an impedance selected to function as a ballast resistance.

This invention further provides a method of eliminating defects occurring in an integrated circuit power transistor array wherein the power transistors are interconnected in a parallel circuit arrangement, and wherein a subset of said power transistors are prone to thermal failure as a result of either one of a thermal runaway and an over-voltage breakdown established at operating conditions at which the power transistors of said array, which do not form part of said subset, will continue to function without manifesting a thermal failure, comprising the steps of associating with each power transistor of said array a fusible structure capable to isolate the related power transistor from said circuit arrangement, said fusible structure having an impedance selected to function as a ballast resistance, said fusible structure comprising a fusible link selected to fuse when subjected to a current manifested by a power transistor undergoing thermal failure, said method also comprising the step of subjecting the array to operating conditions susceptible to induce thermal failure in the power transistors of said subset whereby each manifested thermal failure will fuse the fusible link associated with a power transistor undergoing thermal failure and will isolate said last mentioned power transistor from said circuit arrangement.

DESCRIPTION OF A PREFERRED EMBODIMENT

In many cases, power devices used in cellular telephony, and radio and television broadcasting are not a single transistor. Rather, they are composed of several power transistors connected in a parallel circuit arrangement as Shown in FIG. 1.

Figure 1:
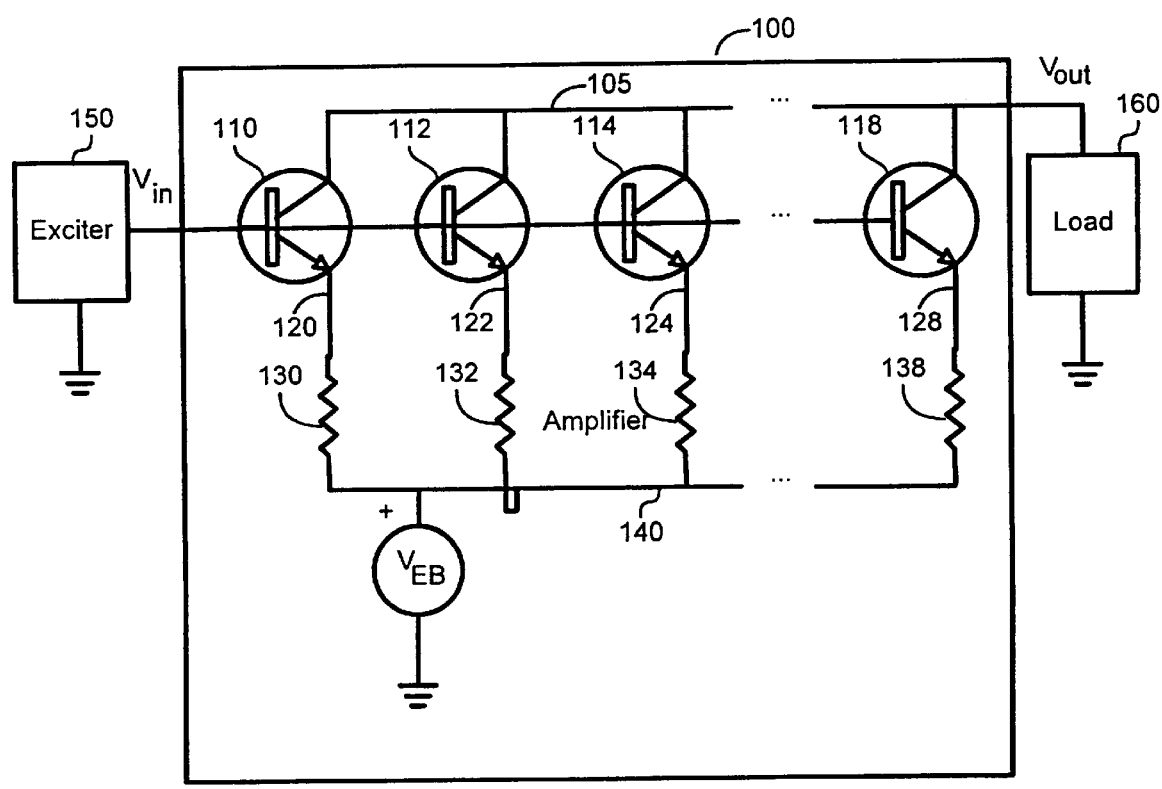
FIG. 1 is a circuit diagram of a prior art power amplifier and associated exciter and load for a simple power device.

FIG. 1 shows a power amplifier 100, an exciter 150 and a load 160. The power amplifier is comprised of an array of power transistors 110, 112, 114 and 118 connected in parallel and a series of ballast resistors 130, 132, 134 and 138 connected to the emitter of each associated transistor through lines 120, 122, 124 and 128. The resistors are connected to the emitter bias Veb through line 140. The number of power transistors in one amplifier for the applications referred to herein is in the order of 200 to 1000. The input signal $V_{in}$ of the amplifier 100 is connected to the base of each transistor 110, 112, 114 and 118. The collector branches of each transistor are connected together through line 105 to provide the output of amplifier 100. Ballast resistors 130, 132, 134 and 138 provide protection for prevention of problems such as thermal runaway. The exciter 150 provides input signal $V_{in}$ which is usually very small such as that produced by the circuitry of a cellular phone. The output $V_{out}$ is fed to a load 160 which can be, for example, the antenna of a cellular phone.

Figure 2:
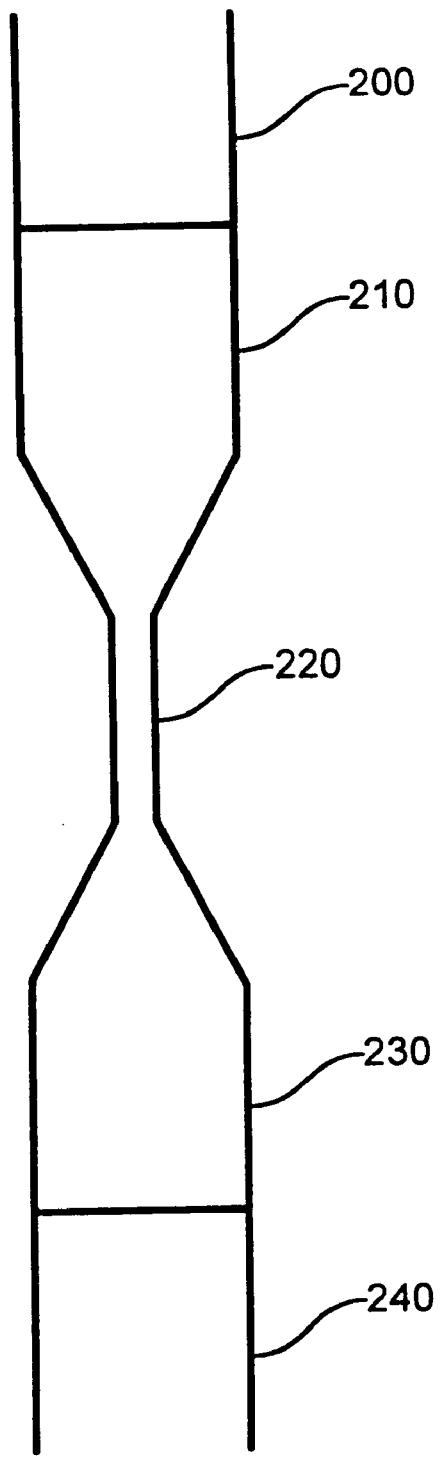
FIG. 2 is an enlarged top view of a ballast fuse in accordance with an embodiment of the invention.

An embodiment of the invention that provides a solution to the problems outlined above is a protection scheme that involves the application of a thin layer of a fusible material to form the ballast resistor components in amplifiers that are made up of multiple transistors such as Bipolar Junction Transistors (BJT). FIG. 2 is an enlarged top view of such a ballast fuse geometry in accordance with an embodiment of the invention. The layer of ballast fuse material, 210, 220 and 230 is shown connected at both ends (210 and 230) to adjacent integrated circuit wiring (200 and 240). The layer of ballast fuse material may be configured as an hourglass projection with end portions of equal width as dictated by integrated circuit design considerations and a narrow region 220 forming a fusible link, which is weaker and which will be the focus of the fusing action.

A material layer is therefore required in the integrated circuit manufacturing process that will provide the ballast resistor function at nominal operating currents and fuse to an open circuit under the higher current conditions that occur at the onset of transistor thermal failure. The nominal operating currents may be in the range of 10 milliamps per transistor and the high current conditions that occur at the onset of thermal failure are approximately 200% to 300% of the normal operating conditions. Examples of typical materials that may be used are Nickel Chromium alloy (Nichrome) and polysilicon. A typical ratio of the narrow region 220 of the ballast fuse material to the wide regions 210 and 230 is 25% to 50%. A width of 10 microns in the wide region 210 and 230 and a layer thickness of 25 nanometers have been trialed and produced very good results. This effectively provides an impedance in the range of 50 ohms.

The exact method for integrating this fusible structure in an integrated circuit will not be described in detail here since it does not involve any inventive ability and a person skilled in the art of integrated circuit manufacturing will readily devise the appropriate fabrication technique to implement this step.

Under normal operating currents, this fusible structure 210 to 230 will operate as a ballast resistor, and will therefore prevent thermal runaway. At higher current level, which is manifested when a power transistor is undergoing a thermal failure as a result of thermal runaway or over-voltage breakdown, the fusible link 220 will fuse (i.e. liquefy with intense heat) to create an open circuit. This fusing mechanism will isolate the related power transistor from the circuit of amplifier 100, and this will limit damage that may occur in parallel transistor configurations due to over-voltage and over-current conditions. In an example embodiment, this fusible structure or ballast fuse component 210 to 230 will be placed in series with each transistor in the circuit such as illustrated in FIG. 3.

Figure 3:
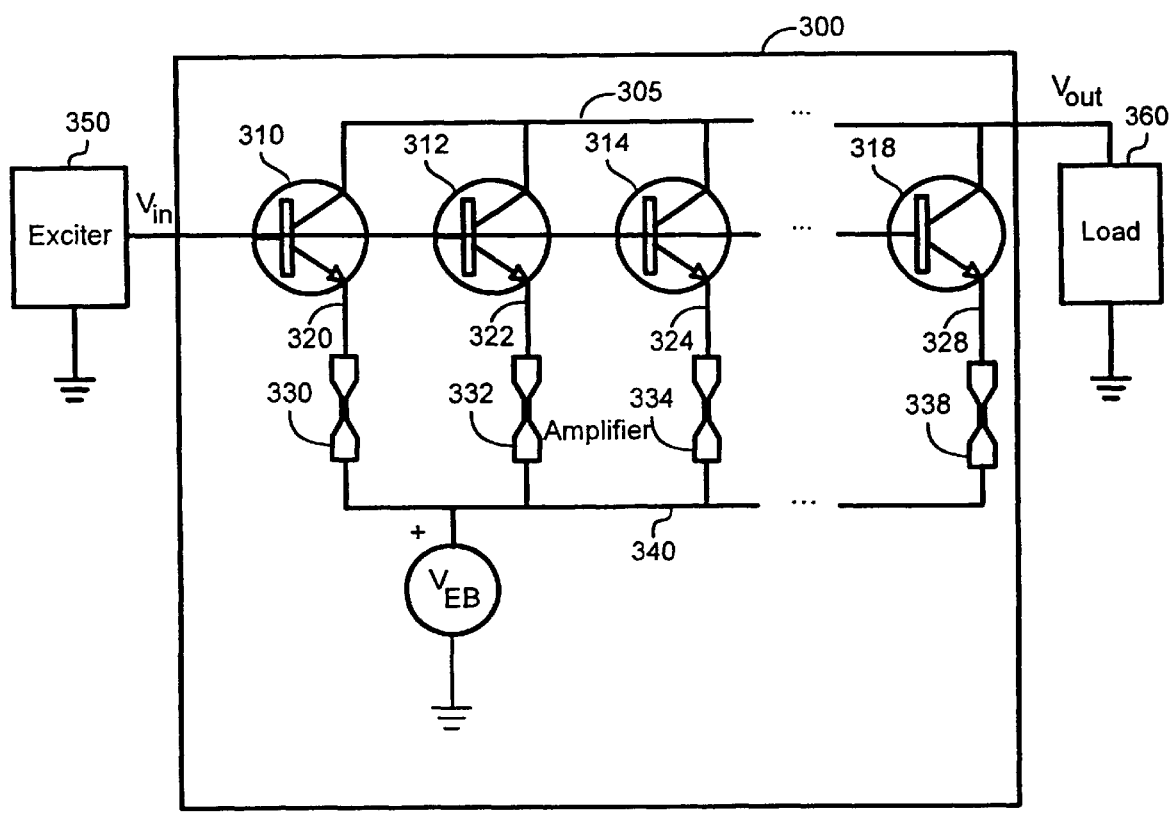
FIG. 3 is a circuit diagram of a power amplifier in accordance with the invention, and associated exciter and load for a simple power device.

FIG. 3 is the same as FIG. 1 with the exception that ballast resistors 130, 132, 134 and 138 have been replaced by fusible structures 330, 332, 334 and 338 in accordance with this invention. These replacements may also result in a reduced number of power transistors 310, 312, 314 and 318 for the same power gain on account of the possibility of operating at or near maximum voltage level. FIG. 3 therefore shows a power amplifier 300, an exciter 350 and a load 360. The power amplifier is comprised of a series of power transistors 310, 312, 314 and 318 connected in parallel and a series of fusible structures 330, 332, 334 and 338 connected to the emitter of each power transistor 310, 312, 314 and 318 through lines 320, 322, 324 and 328. The fusible structures 330, 332, 334 and 338 are connected to the emitter bias Veb ground through line 340. The input of the amplifier 300 $V_{in}$ is connected to the base of each power transistor. The collector branches of each power transistor are connected together through line 305 to provide the output of amplifier 300. The exciter 350 provides the input signal $V_{in}$ and the output to the amplifiers 300 $V_{out}$ is fed to a load 360 which can be, for example, the antenna of a cellular phone.

In such a circuit configuration, the integrated circuit designer will need to provide an array of power transistors which will be sufficient so that removal of the subset of power transistors which are prone to thermal failure due to thermal runaway or over-voltage breakdown will not adversely affect the performance of the amplifier (i.e. will not cause thermal runaway or fusing in series). The designer should ensure that the space saving resulting from the smaller resistors/fuses outweighs the space cost resulting from the additional transistors. The integrated circuit will therefore continue its normal operation with minimal impact on overall performance at a reduced cost.

The above description of a preferred embodiment under the present invention should not be read in a limitative manner as refinements and variations are possible without departing from the spirit of the invention. The scope of the invention is defined in the appended claims and their equivalents.

We claim:

1. An integrated circuit power amplifier comprising a plurality of power transistors interconnected for producing, from an input signal, an output signal of a certain power level, wherein each power transistor is associated with a fusible structure that carries a current passing through the power transistor, said fusible structure having a fusible link for disabling the associated power transistor in the event that the output current of said associated power transistor exceeds a safe level, said fusible structure comprising a ballast fuse serially connected to the output of the associated power transistor, said ballast fuse comprising a body of resistive material which operates as a ballast resistance under normal operating conditions.

2. An integrated power amplifier as defined in claim 1, wherein said body of resistive material comprises a fusible portion that defines said fusible link.

3. An integrated circuit power amplifier as defined in claim 2, wherein said power transistors are comprised of a plurality of bipolar junction transistors, each bipolar junction transistor having an emitter serially connected to a dedicated ballast fuse, said dedicated ballast fuse being operative to fuse to create an open circuit in the event that the emitter current reaches a level indicative of transistor failure.

4. An integrated circuit power amplifier comprising a plurality of power transistors interconnected in a circuit arrangement, a subset of said power transistors being prone to thermal failure as a result of either one of a thermal runaway and an over-voltage breakdown established at operating conditions at which the power transistors of said plurality of power transistors, which do not form part of said subset, will continue to function without manifesting a thermal failure, said integrated circuit power amplifier also comprising a fusible structure associated with a respective power transistor, said fusible structure having a fusible link to isolate the respective power transistor from said circuit arrangement when fusing, said fusible link being selected to fuse when subjected to a current manifested by a power transistor undergoing a thermal failure, said fusible structure comprising a ballast fuse serially connected to the output of the associated power transistor, said ballast fuse comprising a body of resistive material which operates as a ballast resistance under normal operating conditions.

5. An integrated circuit power amplifier as described in claim 4, wherein said body of resistive material comprises a fusible portion that defines said fusible link.

6. An integrated circuit power amplifier as described in claim 5 wherein said plurality of power transistors are interconnected in a parallel circuit arrangement.

7. An integrated circuit power amplifier as described in claim 6, wherein each of said fusible structures is connected in series to the output of the associated power transistor.

8. A method for protecting an integrated circuit power amplifier comprising plurality of power transistors interconnected in a circuit arrangement for amplifying an input signal to produce an output signal of a certain power level, said method comprising the step of:

associating with each power transistor of said plurality of power transistors a fusible structure, said fusible structure carrying an output current passing through a related power transistor, said fusible structure having a fusible link for disabling said related power transistor in the event that the power output current passing through said related power transistor exceeds a safe level, said fusible structure operating as a ballast resistance when the power output current passing through said related power transistor is within said safe level.

9. A method as defined in claim 8, wherein said body of resistive material comprises a fusible portion that defines said fusible link.

10. A method of eliminating defects occurring in an integrated circuit power transistor array wherein the power transistors are interconnected in a parallel circuit arrangement, and wherein a subset of said power transistors are prone to thermal failure as a result of either one of a thermal runaway and an over-voltage breakdown established at operating conditions at which the power transistors of said array, which do not form part of said subset, will continue to function without manifesting a thermal failure, comprising the steps of:

associating with each power transistor of said array a fusible structure capable to isolate the related power transistor from said circuit arrangement, said fusible structure having an impedance selected to function as a ballast resistance under normal operating conditions, said fusible structure comprising a fusible link selected to fuse when subjected to a current manifested by a power transistor undergoing thermal failure;

subjecting the array to operating conditions susceptible to induce thermal failure in the power transistors of said subset whereby each manifested thermal failure will fuse the fusible link associated with a power transistor undergoing thermal failure and will isolate said last mentioned power transistor from said circuit arrangement.

* * * * *